United States Patent
Hutchison et al.

(10) Patent No.: US 10,921,024 B2
(45) Date of Patent: Feb. 16, 2021

(54) DRAIN FEATURE FOR A JUNCTION BOX OF A WATER HEATER

(71) Applicant: Haier US Appliance Solutions, Inc., Wilmington, DE (US)

(72) Inventors: Gregory L. Hutchison, Shelbyville, KY (US); Timothy David Gantt, Goshen, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 119 days.

(21) Appl. No.: 16/100,304

(22) Filed: Aug. 10, 2018

(65) Prior Publication Data
US 2020/0049376 A1 Feb. 13, 2020

(51) Int. Cl.
*F24H 9/16* (2006.01)
*H05K 5/06* (2006.01)
*H05K 5/02* (2006.01)
*F24H 9/20* (2006.01)

(52) U.S. Cl.
CPC .............. *F24H 9/16* (2013.01); *F24H 9/2021* (2013.01); *H05K 5/0213* (2013.01); *H05K 5/069* (2013.01)

(58) Field of Classification Search
CPC .......... F24H 9/16; F24H 9/2021; F24H 9/165; H05K 5/069; H05K 5/0213; H05K 5/0247
See application file for complete search history.

(56) References Cited

U.S. PATENT DOCUMENTS

| | | | | |
|---|---|---|---|---|
| 6,182,305 | B1 * | 2/2001 | O'Connell | A47B 77/02 269/289 R |
| 8,104,634 | B2 * | 1/2012 | Gregg | E03C 1/182 220/476 |
| 8,807,093 | B2 * | 8/2014 | Steinhafel | F24H 1/00 122/135.3 |
| 9,175,434 | B1 * | 11/2015 | Brown | D06F 58/02 |
| 9,194,606 | B2 * | 11/2015 | Braathen | F24H 9/02 |
| 2012/0118989 | A1 * | 5/2012 | Buescher | F24H 9/2021 237/8 A |
| 2012/0291719 | A1 * | 11/2012 | Steinhafel | F24H 1/00 122/18.3 |
| 2018/0031275 | A1 * | 2/2018 | Wilson | F24F 1/00 |
| 2018/0224156 | A1 * | 8/2018 | Steinhafel | F24H 9/2035 |
| 2020/0025416 | A1 * | 1/2020 | Hutchison | F24H 9/2021 |

FOREIGN PATENT DOCUMENTS

| | | |
|---|---|---|
| CN | 201335542 Y | 10/2009 |
| CN | 207010140 U | 2/2018 |
| JP | 11215653 A * | 8/1999 |
| JP | 2006067709 A * | 3/2006 |
| JP | 2017009263 A | 1/2017 |

* cited by examiner

*Primary Examiner* — Gregory A Wilson
(74) *Attorney, Agent, or Firm* — Dority & Manning, P.A.

(57) ABSTRACT

A water heater appliance is provided that includes features for removing water from a junction box of the water heater appliance. More particularly, a water heater is provided that includes a draining feature that drains or removes water that has seeped or leaked into a junction box that is at least partially encased in an insulation material. In one exemplary aspect, the drain feature includes a drain conduit connected to an outlet defined by the junction box. The drain conduit may drain the water from the junction box to a number of suitable locations. For instance, the water may be drained to a dedicated drain port or a cavity defined in part by an access panel removably mounted to a casing of the water heater appliance.

20 Claims, 6 Drawing Sheets

DRAIN FEATURE FOR A JUNCTION BOX OF A WATER HEATER

FIELD OF THE INVENTION

The subject matter of the present disclosure relates generally to water heater appliances.

BACKGROUND OF THE INVENTION

Water heaters provide for the heating and storage of water for various uses. A heat source is provided for raising the temperature of water in a water tank. The heat energy may be supplied e.g., by gas burners, electrically resistant coils, or a heat pump using a refrigerant cycle. Typically, the water tank is surrounded by a casing and is insulated to prevent the water stowed within the water tank from heat loss before use.

Many water heater appliances include various power consuming loads. For instance, some water heaters may include a controller, a display, electric heating sources, and other power consuming loads. To provide electrical power to such power consuming loads, an electrical conduit or power supply line typically is fed to a junction box of the water heater. The junction box may provide a means of grounding the incoming wires and a means for providing a safe environment for making electrical connections. In some instances, water may leak or seep into the junction box. For example, water may drip along the power supply line or a pipe above the water heater may leak water into the junction box. Consequently, the junction box may fill with water, particularly when the junction box is encased or at least partially encased within foam insulation disposed between the casing and the water tank. Water within the junction is undesirable. For instance, water may short or damage the electrical components within the junction box and thus an unsafe condition may result.

Accordingly, a water heater appliance that addresses one or more challenges noted above would be useful.

BRIEF DESCRIPTION OF THE INVENTION

Aspects and advantages of the invention will be set forth in part in the following description, or may be apparent from the description, or may be learned through practice of the invention.

In one exemplary embodiment, a water heater appliance is provided. The water heater appliance includes a casing. The water heater appliance also includes a tank positioned within the casing and defining a chamber for heating water. Further, the water heater appliance includes a heating source in thermal communication with the tank for selectively heating water within the chamber. Moreover, the water heater appliance includes a junction box mounted to the casing, the junction box defining an outlet. Further, the water heater appliance includes a drain conduit in fluid communication with the outlet for draining fluid from the junction box.

In another exemplary embodiment, a water heater appliance is provided. The water heater appliance includes a casing comprising a top cover. The water heater appliance also includes a tank positioned within the casing and defining a chamber for heating water. Moreover, the water heater appliance includes a heating source in thermal communication with the tank for selectively heating water within the chamber. The water heater appliance further includes a junction box mounted to the top cover, the junction box defining an outlet. The water heater appliance also includes an insulation material at least partially encasing the junction box. The water heater appliance also includes a drain conduit in fluid communication with the outlet for draining fluid from the junction box.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
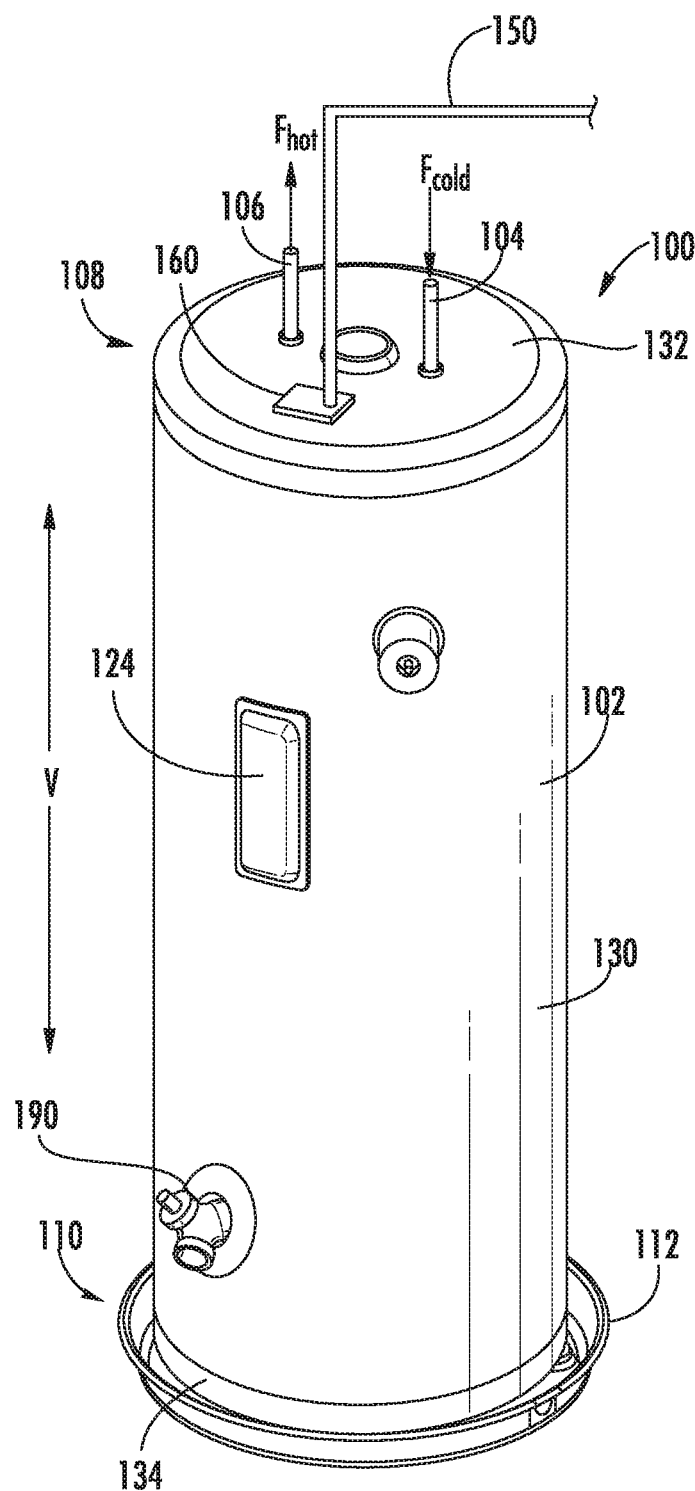
FIG. 1 provides a perspective view of a water heater appliance according to an exemplary embodiment of the present subject matter.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents. As used herein, terms of approximation, such as "approximately," "substantially," or "about," refer to being within a ten percent (10%) margin of error.

FIG. 1 provides a perspective view of a water heater appliance 100 according to an exemplary embodiment of the present subject matter. Water heater appliance 100 includes a casing 102 that generally surrounds a tank 120 (FIG. 5) and may be formed from a variety of components. As illustrated, casing 102 may include a wrapper or jacket 130 and one or more covers, such as a top cover 132 and a bottom cover 134. The covers may be coupled to wrapper 130 to form casing 102.

Water heater appliance 100 also includes a cold water conduit 104 and a hot water conduit 106 that are both in fluid communication with a chamber 122 (FIG. 5) defined by tank 120. As an example, cold water from a water source, e.g., a municipal water supply or a well, can enter water heater appliance 100 through cold water conduit 104 (shown schematically with arrow labeled $F_{cold}$). Cold water can enter chamber 122 of tank 120 through cold water conduit 104 wherein it is heated by a heating source 118 (FIG. 5), such as e.g., an electric heating element. Thus, heating source 118 is in thermal communication with tank 120 for selectively heating water within chamber 122 of tank 120. Such heated water can exit water heater appliance 100 at hot water conduit 106 (shown schematically with arrow labeled $F_{hot}$) and, e.g., be supplied to a bath, shower, sink, or any other suitable feature.

Water heater appliance 100 defines a vertical direction V as shown in FIG. 1. Water heater appliance 100 extends between a top portion 108 and a bottom portion 110 along the vertical direction V. Thus, water heater appliance 100 is generally vertically oriented. Water heater appliance 100 can be leveled, e.g., such that casing 102 is plumb in the vertical direction V, to facilitate proper operation of water heater appliance 100. A drain pan 112 is positioned at bottom portion 110 of water heater appliance 100 such that water heater appliance 100 sits on drain pan 112. Drain pan 112 sits beneath water heater appliance 100 along the vertical direction V, e.g., to collect water.

Tank 120 (FIG. 5) is configured for storing heated water. As will be understood by those skilled in the art and as used herein, the term "water" includes purified water and solutions or mixtures containing water and, e.g., elements (such as calcium, chlorine, and fluorine), salts, bacteria, nitrates, organics, and other chemical compounds or substances. Tank 120 may have a generally cylindrically-shaped body that extends vertically between a tank bottom and a tank top. For this exemplary embodiment, water heater appliance 100 is shown as an electric water heater that utilizes heating source 118 (FIG. 5), which in this embodiment is an electric resistance heating element to transfer heat to water in tank 120. However, the present subject matter is not limited to electric water heaters. As will be understood by one of skill in the art using the teachings disclosed herein, the present subject matter may also be used with, e.g., water heaters that rely upon heat pump coils carrying refrigerant, gas burners, and/or other heat sources as well.

In some embodiments, water heater appliance 100 may include a user interface panel (not shown), e.g., mounted to top cover 132 or wrapper 130 of water heater appliance 100. The user interface panel may include input components or controls, such as one or more of a variety of electrical, mechanical, or electro-mechanical input devices. The controls may include, for example, rotary dials, knobs, push buttons, and/or touch pads. The water heater appliance 100 may also include a controller (not shown) that is communicatively coupled with user interface panel and controls, e.g., by a suitable wired or wireless connection, for controlling water heater appliance 100. Thus, a user may select various operational features and modes via the controls and may monitor progress of water heater appliance 100, e.g., via a display, such as a digital or analog display communicatively coupled with the controller. The display may be configured to provide operational feedback to a user, among other possible items. In certain embodiments, user interface panel represents a general purpose I/O ("GPIO") device or functional block.

As noted above, the controller may be communicatively coupled (i.e., in operative communication) with the user interface panel. The controller may also be communicatively coupled with various operational components of water heater appliance 100 as well, such as heating source 118 (FIG. 5), sensors, etc. Input/output ("I/O") signals may be routed between the controller and the various operational components of water heater appliance 100. Thus, the controller can selectively activate and operate these various components. Various components of water heater appliance 100 are communicatively coupled with the controller via one or more communication lines such as, for example, conductive signal lines, shared communication busses, or wireless communications bands.

In some embodiments, controller includes one or more memory devices and one or more processors. The processors can be any combination of general or special purpose processors, CPUs, or the like that can execute programming instructions or control code associated with operation of water heater appliance 100. The memory devices (i.e., memory) may represent random access memory such as DRAM or read only memory such as ROM or FLASH. In one embodiment, the processor executes programming instructions stored in memory. The memory may be a separate component from the processor or may be included onboard within the processor. Alternatively, the controller may be constructed without using a processor, for example, using a combination of discrete analog or digital logic circuitry (such as switches, amplifiers, integrators, comparators, flip-flops, AND gates, and the like) to perform control functionality instead of relying upon software.

In certain embodiments, the controller includes a network interface such that controller can connect to and communicate over one or more networks with one or more network nodes. The controller can also include one or more transmitting, receiving, or transceiving components for transmitting/receiving communications with other devices communicatively coupled with water heater appliance 100. Additionally or alternatively, one or more transmitting, receiving, or transceiving components can be located off board the controller. Generally, the controller can be positioned in any suitable location throughout water heater appliance 100. For example, the controller may be located proximate the user interface panel.

As further shown in FIG. 1, an electrical conduit 150 is connected to water heater appliance 100. For this embodiment, electrical conduit 150 is a power supply line for providing electrical power to water heater appliance 100. More particularly, for this embodiment, electrical conduit 150 is a power supply line that facilitates electrical communication between a power source and various features of water heater appliance 100, such as e.g., features of user control panel, the controller, heating sources 118, etc. Electrical conduit 150 may carry one or more electrical wires or may itself be a wire. Electrical conduit 150 may be flexible or rigid. As depicted in FIG. 1, electrical conduit 150 connects to or enters water heater appliance 100 at an access point of water heater appliance 100. For this embodiment, the access point is a junction box 160 mounted to top cover 132 of casing 102 and one or more wires carried by electrical conduit 150 extend into junction box 160 and electrically connect with corresponding wires of water heater appliance 100. In alternative embodiments, junction box 160 may be mounted to casing 102 in other suitable locations.

In some instances, water may leak from pipes above water heater appliance 100 or condensed moisture may drip along electrical conduit 150 and down into junction box 160. Water filling into junction box 160 is undesirable for safety and operational purposes. For instance, if water fills to a predetermined level within junction box 160, one or more electrical connectors or connections within junction box 160 may short or become damaged by the water. As will be described below, in accordance with exemplary aspects of the present disclosure, water heater appliance 100 includes features for draining or removing water from junction box 160.

Figure 2:
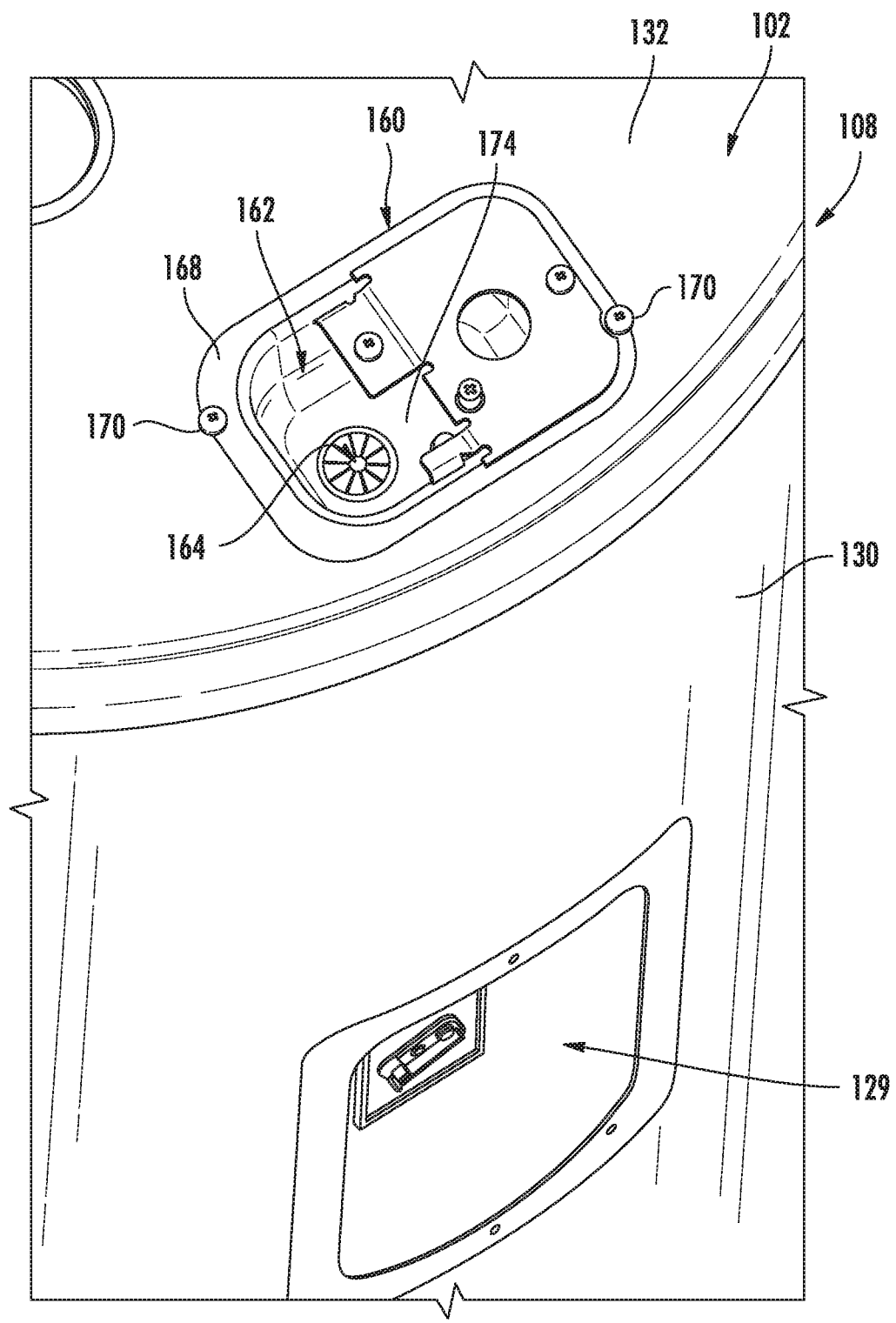
FIG. 2 provides a close up, perspective view of an exemplary junction box of the water heater appliance of FIG. 1.
Figure 3:
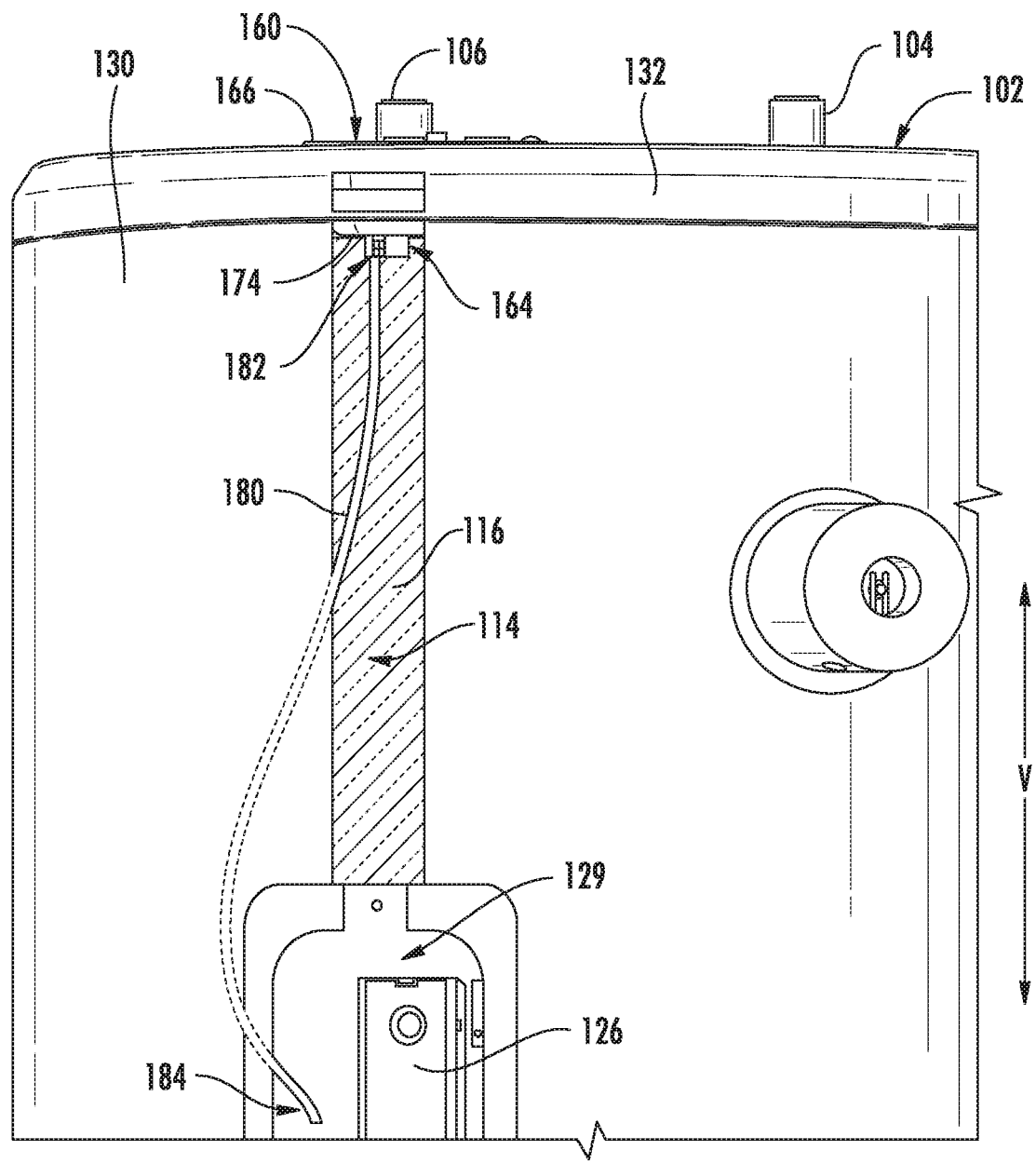
FIG. 3 provides a side perspective view of the water heater appliance of FIG. 1 with a portion of a casing of the water heater appliance removed to reveal a drain feature for draining the junction box.
Figure 4:
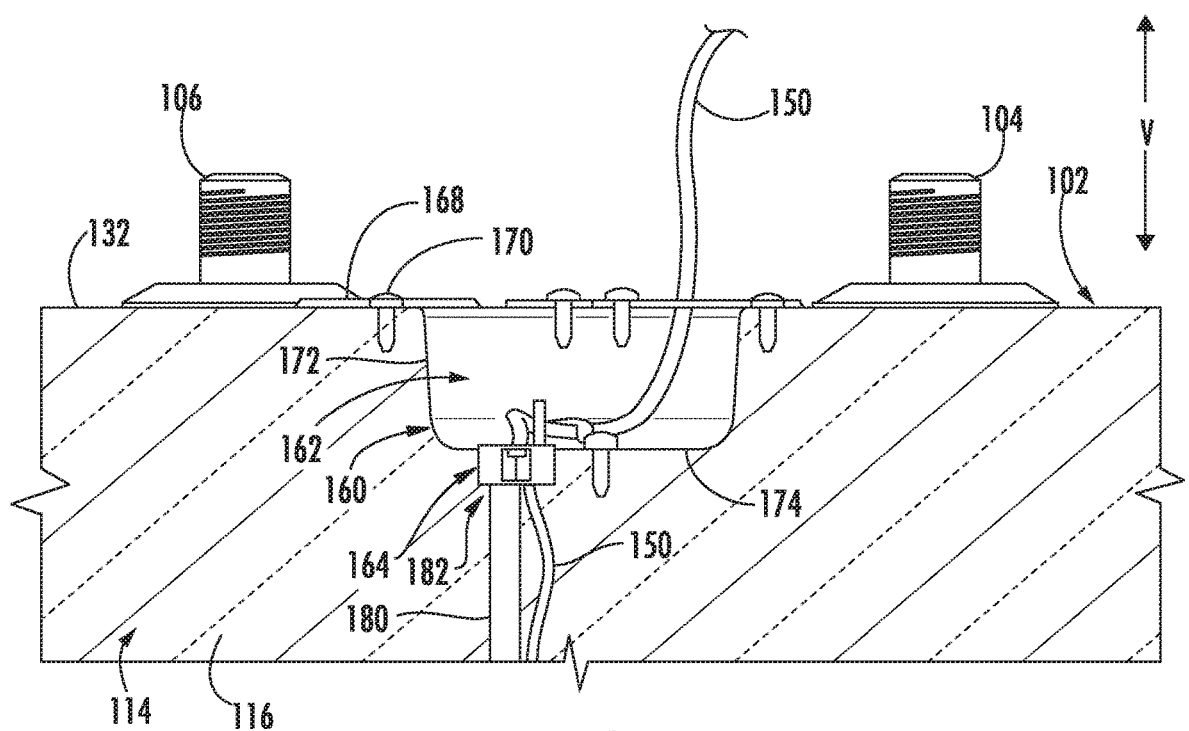
FIG. 4 provides a side cross-sectional view of the junction box of FIG. 2.
Figure 5:
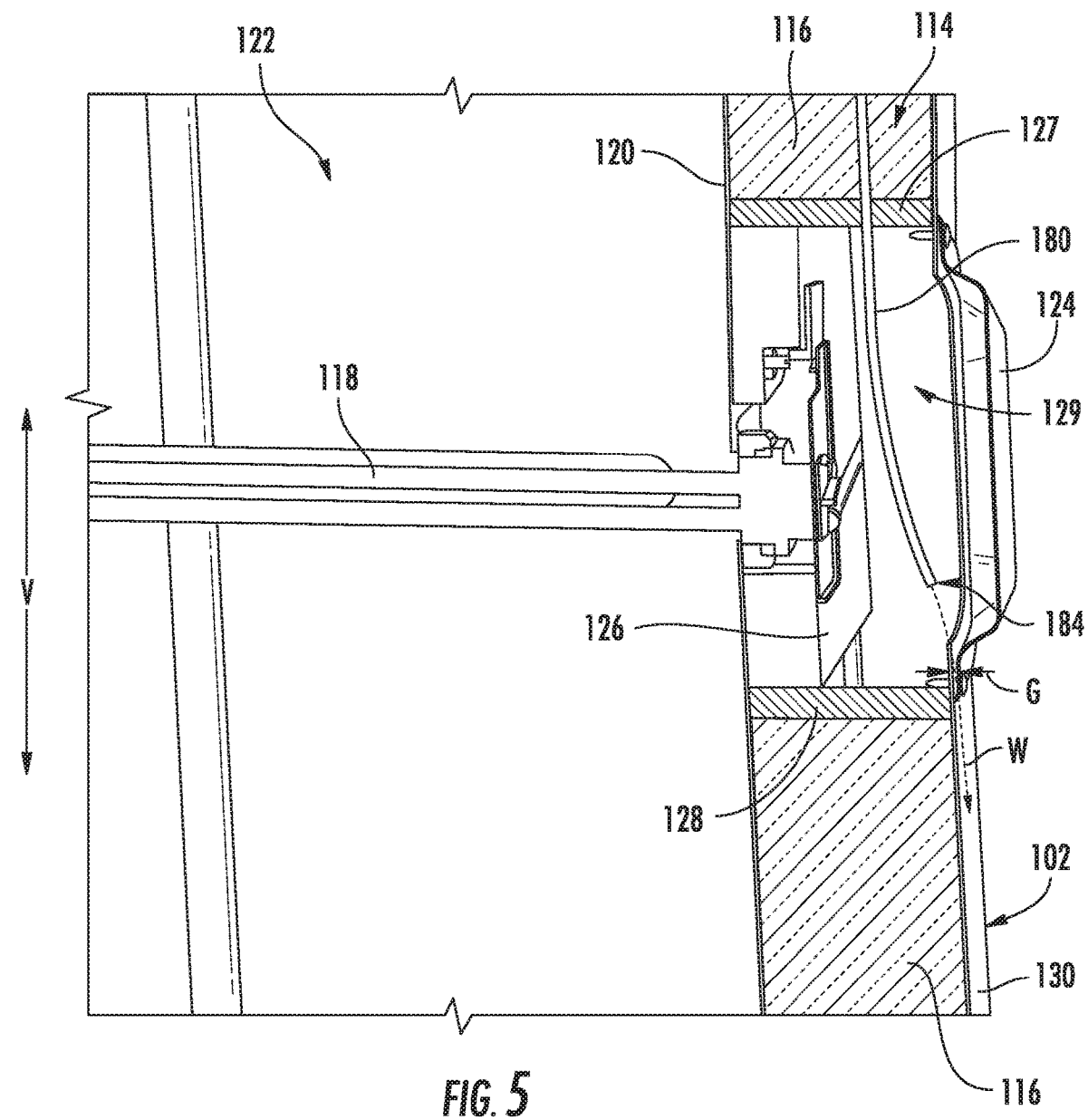
FIG. 5 provides a cross-sectional view of the water heater appliance of FIG. 1.

FIGS. 2, 3, 4, and 5 provide various views of certain features of water heater appliance 100 that facilitate draining or removal of water from junction box 160. In particular, FIG. 2 provides a close up, perspective view of junction box 160 of water heater appliance 100. FIG. 3 provides a side perspective view of the water heater appliance 100 with a portion of casing 102 removed to reveal a drain feature for draining junction box 160. FIG. 4 provides a side cross-sectional view of junction box 160. FIG. 5 provides a cross-sectional view of water heater appliance 100.

As shown best in FIGS. 2 and 4, junction box 160 is mounted to casing 102. More particularly, junction box 160 includes a mounting flange 168 that is mounted to top cover 132 via one or more mechanical fasteners 170, e.g., screws. Junction box 160 defines a volume 162 into which one or more wires extend as shown best in FIG. 4. More particularly, junction box 160 includes one or more sidewalls 172 and a floor 174 that define volume 162 of junction box 160. Within the volume 162 of junction box 160, the one or more electrical wires carried by electrical conduit 150 may be grounded, e.g., by an electrical ground. One or more wires may exit junction box 160 via an outlet 164 defined by junction box 160. For this embodiment, outlet 164 is defined by floor 174 at a bottom portion of junction box 160; however, outlet 164 may be defined at other suitable locations as well. The one or more wires that electrically connect with the wires carried by electrical conduit 150 within junction box 160 may extend to various power consuming loads of water heater appliance 100, such as e.g., features of the user interface panel, controller, heating sources 118, etc. Junction box 160 also includes an access door 166 (FIG. 3) for selectively providing access to volume 162 of junction box 160, e.g., for installation or maintenance purposes. Access door 166 has been removed from FIG. 2 for illustrative purposes. Further, as depicted best in FIGS. 3 and 4, an insulation material 116 at least partially encases junction box 160. For this embodiment, insulation 116 encases substantially all of junction box 160. Insulation 116, such as an expanding foam insulation, is provided within an interior 114 defined by casing 102 to reduce the amount of heat transfer to the environment. Insulation 116 can be provided as foamed-in insulation but other materials may be used as well. Insulation material 116 may be disposed annularly between casing 102 and tank 120 (FIG. 5).

As shown best in FIG. 3, water heater appliance 100 includes a drain conduit 180 in fluid communication with outlet 164 of junction box 160. Drain conduit 180 is configured for draining or carrying away fluid from junction box 160, such as e.g., water that has seeped or leaked into junction box 160. In some embodiments, drain conduit 180 is formed of a non-conductive material, such as e.g., plastic, rubber, etc. In this way, drain conduit 180 may electrically isolate the water flowing therein from electrical wires or components positioned nearby. Drain conduit 180 extends between a first end and a second end, or stated differently, a conduit inlet 182 and a conduit outlet 184, respectively. Conduit inlet 182 of drain conduit 180 is connected to junction box 160 at outlet 164 in this embodiment. Thus, water that fills or seeps into volume 162 of junction box 160 may exit the junction box through outlet 164 and may flow into drain conduit 180. In other exemplary embodiments, conduit inlet 182 of drain conduit 180 may be connected to other objects or structures within or at junction box 160, such as e.g., one or more structures of the electrical ground.

Conduit outlet 184 of drain conduit 180 may be positioned in a number of suitable locations. As one example, as shown best in FIG. 1, water heater appliance 100 includes a drain port 190 mounted to casing 102, and more particularly to wrapper 130 of casing 102. In such embodiments, conduit outlet 184 is connected to drain port 190. That is, conduit outlet 184 is fluidly connected with drain port 190. In this way, when water fills into junction box 160, the water may be drained from junction box 160 via drain conduit 180 and may exit water heater appliance 100 through drain port 190. Accordingly, water is prevented from filling to an undesirable level within junction box 160. Notably, drain port 190 is positioned below junction box 160 along the vertical direction V. That is, drain port 190 is positioned vertically below junction box 160. In this way, gravity may be utilized to drain water from junction box 160 to drain port 190. The water may exit drain port 190 and flow to e.g., drain pan 112 (FIG. 1), to a hose connected thereto, or another suitable location or water collection device.

As another example, conduit outlet 184 may be positioned in a cavity 129 defined by water heater appliance 100 and thus water may drain into cavity 129. More particularly, as best shown in FIG. 5, water heater appliance 100 includes an access panel 124 removably mounted to casing 102. For this embodiment, access panel 124 is removably mounted to wrapper 130. Moreover, for this embodiment, access panel 124 is a heat source or element cover; thus, access panel 124 provides selective access to heating source 118, e.g., for maintenance. As further shown in FIG. 5, water heater appliance 100 includes an interior panel 126 spaced from access panel 124. More specifically, interior panel 126 is spaced radially from access panel 124, wherein the radial direction is a direction orthogonal to the vertical direction and one that extends to and from a vertical centerline of water heater appliance 100. Moreover, water heater appliance 100 includes a top or first dam 127 spanning between access panel 124 and interior panel 126 and a second dam 128 spanning between access panel 124 and interior panel 126. Second dam 128 is spaced from first dam 127, e.g., along the vertical direction V. Insulation material 116 is positioned within interior 114 between tank 120 and wrapper 130 vertically above first dam 127 and vertically below second dam 128. Access panel 124, interior panel 126, first dam 127, and second dam 128 define cavity 129 as shown in FIG. 5.

As noted above, for this embodiment with reference still to FIG. 5, conduit outlet 184 of drain conduit 180 is positioned within cavity 129. Thus, when water drains from junction box 160 through outlet 164 and is carried away from junction box 160 by drain conduit 180, the water may exit through conduit outlet 184 and empty into cavity 129. After water exits conduit outlet 184 of drain conduit 180 and empties into cavity 129, as denoted by the dashed line labeled "W" in FIG. 5, the water may exit water heater appliance 100 through one or more gaps G defined between access panel 124 and casing 102. The water may proceed down the side of the casing 102 and may be collected by drain pan 112 (FIG. 1), for example. Further, for this embodiment, access panel 124 is removably mounted to casing 102 below junction box 160 along the vertical direction V. Thus, gravity may be utilized to drain water from junction box 160 to cavity 129.

For this embodiment, as shown best in FIG. 4, one or more wires extend through outlet 164 defined by junction box 160. Thus, the one or more wires and drain conduit 180 share a common outlet, or outlet 164.

Figure 6:
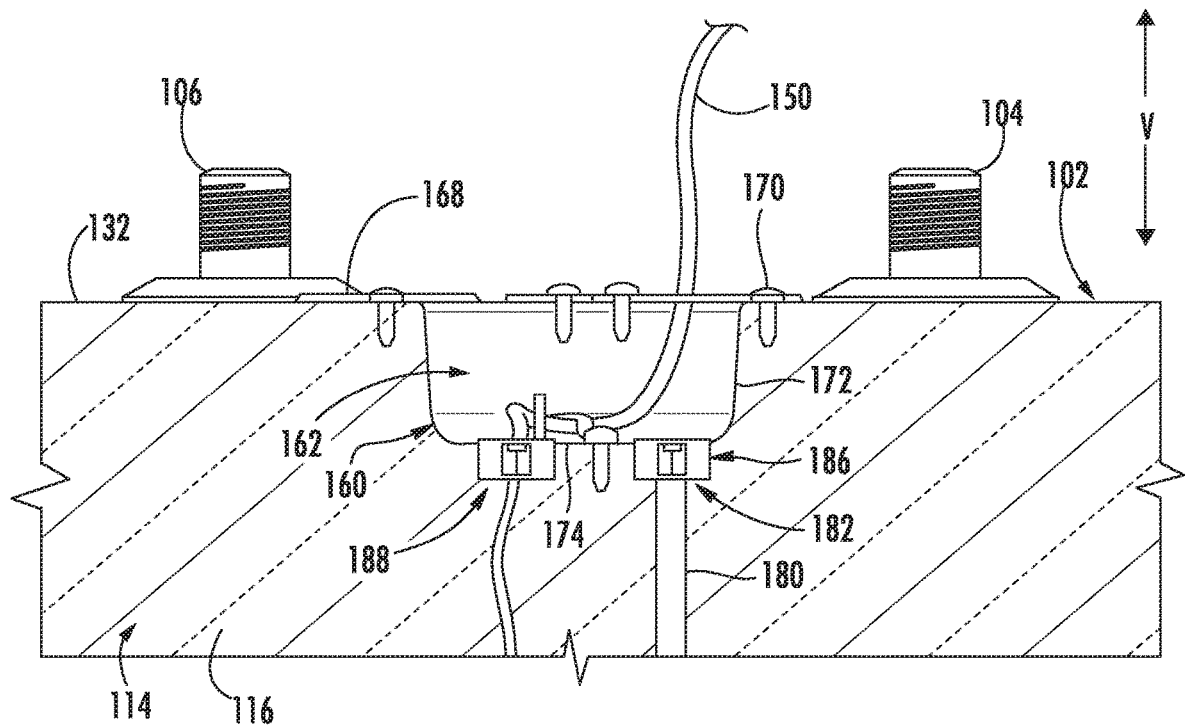
FIG. 6 provides a side cross-sectional view of another exemplary junction box in accordance with an exemplary embodiment of the present subject matter.

Referring now to FIG. 6, in some alternative exemplary embodiments, junction box 160 defines at least two (2) outlets, including a drain outlet 186 and an electrical outlet 188. In the depicted embodiment of FIG. 6, floor 174 of junction box 160 defines both drain outlet 186 and electrical outlet 188. Drain outlet 186 and electrical outlet 188 are spaced from one another. For instance, in FIG. 6, drain outlet 186 and electrical outlet 188 are placed at or proximate opposing ends of junction box 160. As further shown in FIG. 6, in such embodiments, conduit inlet 182 of drain conduit 180 is connected to drain outlet 186 and one or more wires may extend through electrical outlet 188. Moreover, for this embodiment, drain outlet 186 and electrical outlet 188 are defined at the same vertical position. That is, drain outlet 186 and electrical outlet 188 are even with one another along the vertical direction V. However, in some embodiments, as will be explained further below, electrical outlet 188 is positioned above drain outlet 186 along the vertical direction V.

Figure 7:
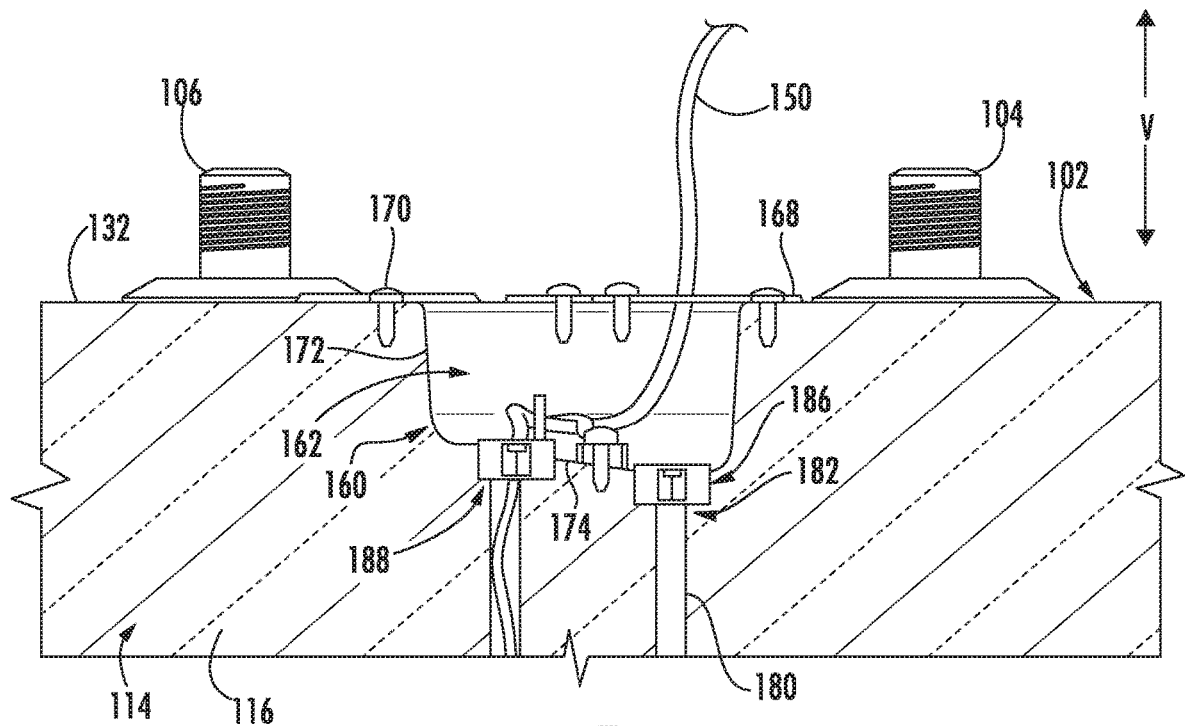
FIG. 7 provides a side cross-sectional view of yet another exemplary junction box in accordance with an exemplary embodiment of the present subject matter.

Referring now to FIG. 7, in some exemplary embodiments, floor 174 of junction box 160 is slanted or angled downward along the vertical direction V toward the outlet. More particularly, floor 174 slants downward toward drain outlet 186 along the vertical direction V. Accordingly, when water seeps or leaks into volume 162 of junction box 160, gravity causes the water to flow toward drain outlet 186 so that the water may be drained from junction box 160. In this manner, water is prevented from pooling or collecting in junction box 160. In some embodiments, as shown in FIG. 7, floor 174 is angled downward toward drain outlet 186 by at least thirty degrees (30°) with respect to a horizontal direction, which is a direction orthogonal to the vertical direction V. In yet other embodiments, floor 174 is angled downward toward drain outlet 186 by at least forty-five degrees (45°) with respect to the horizontal direction.

Moreover, in embodiments where junction box 160 defines a common outlet for drain conduit 180 and one or more wires, e.g. as shown in FIG. 4, floor 174 may be slanted or angled downward toward outlet 164 along the vertical direction V. For instance, in some embodiments, floor 174 is angled downward toward outlet 164 by at least thirty degrees (30°) with respect to the horizontal direction. In some other embodiments, floor 174 is angled downward toward outlet 164 by at least forty-five degrees (45°) with respect to the horizontal direction.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they include structural elements that do not differ from the literal language of the claims or if they include equivalent structural elements with insubstantial differences from the literal language of the claims.

What is claimed is:

1. A water heater appliance, comprising:
    a casing having a top cover and a wrapper coupled with the top cover;
    a tank positioned within the casing and defining a chamber for heating water;
    a heating source in thermal communication with the tank for selectively heating water within the chamber;
    a junction box mounted to the top cover, the junction box having a floor defining an outlet, the floor of the junction box being positioned at a bottom portion of the junction box; and
    a drain conduit connected to the outlet for draining fluid from the junction box.

2. The water heater appliance of claim 1, further comprising:
    an insulation material at least partially encasing the junction box.

3. The water heater appliance of claim 1, further comprising:
    an access panel removably mounted to the casing;
    an interior panel spaced from the access panel;
    a first dam spanning between the access panel and the interior panel; and
    a second dam spanning between the access panel and the interior panel, the second dam spaced from the first dam, wherein the access panel, the interior panel, the first dam, and the second dam define a cavity.

4. The water heater appliance of claim 3, wherein the drain conduit extends between a conduit inlet and a conduit outlet, and wherein the conduit inlet of the drain conduit is connected to the junction box at the outlet and the conduit outlet of the drain conduit is positioned within the cavity.

5. The water heater appliance of claim 4, wherein the water heater appliance defines a vertical direction, and wherein the access panel is removably mounted to the casing below the junction box along the vertical direction.

6. The water heater appliance of claim 1, wherein the drain conduit extends between a conduit inlet and a conduit outlet, and wherein the water heater appliance further comprises:
    a drain port mounted to the casing, and wherein the conduit inlet of the drain conduit is connected to the junction box at the outlet and the conduit outlet of the drain conduit is connected to the drain port.

7. The water heater appliance of claim 1, wherein one or more electrical wires extend through the outlet defined by the junction box.

8. The water heater appliance of claim 1, wherein the outlet defined by the junction box is a drain outlet, and wherein the junction box defines an electrical outlet through which the one or more electrical wires extend.

9. The water heater appliance of claim 1, wherein the water heater appliance defines a vertical direction, and wherein the floor of the junction box is slanted downward along the vertical direction toward the outlet.

10. The water heater appliance of claim 1, wherein the water heater appliance defines a vertical direction, and wherein the outlet defined by the floor of the junction box is a drain outlet, and wherein the floor of the junction box defines an electrical outlet through which one or more electrical wires extend, and wherein the electrical outlet is positioned above the drain outlet along the vertical direction.

11. The water heater appliance of claim 1, wherein the drain conduit is formed of a non-conductive material.

12. A water heater appliance, comprising:
    a casing comprising a top cover;
    a tank positioned within the casing and defining a chamber for heating water;

a heating source in thermal communication with the tank for selectively heating water within the chamber;

a junction box mounted to the top cover, the junction box defining an outlet;

an insulation material at least partially encasing the junction box;

a drain conduit in fluid communication with the outlet for draining fluid from the junction box;

an access panel removably mounted to the casing for selectively providing access to the heating source;

an interior panel spaced from the access panel;

a first dam spanning between the access panel and the interior panel; and a second dam spanning between the access panel and the interior panel, the second dam spaced from the first dam, wherein the access panel, the interior panel, the first dam, and the second dam define a cavity, and wherein the drain conduit extends between a conduit inlet and a conduit outlet, and wherein the conduit inlet of the drain conduit is connected to the junction box at the outlet and the conduit outlet of the drain conduit is positioned within the cavity.

13. The water heater appliance of claim 12, wherein one or more electrical wires extend through the outlet defined by the junction box.

14. The water heater appliance of claim 12, wherein the water heater appliance defines a vertical direction, and wherein the junction box comprises one or more sidewalls and a floor defining a volume of the junction box, and wherein the floor of the junction box is slanted downward along the vertical direction toward the outlet by at least thirty degrees with respect to a horizontal direction that is orthogonal to the vertical direction.

15. The water heater appliance of claim 12, wherein the drain conduit extends between a conduit inlet and a conduit outlet, and wherein the water heater appliance further comprises:

a drain port mounted to a wrapper of the casing, and wherein the conduit inlet of the drain conduit is connected to the junction box at the outlet and the conduit outlet of the drain conduit is connected to the drain port.

16. A water heater appliance defining a vertical direction, the water heater appliance comprising:

a casing;

a tank positioned within the casing and defining a chamber for heating water;

a heating source in thermal communication with the tank for selectively heating water within the chamber;

a junction box mounted to the casing, the junction box having one or more sidewalls and a floor defining a volume of the junction box, the floor defining an outlet, wherein the floor of the junction box is slanted downward along the vertical direction toward the outlet; and a drain conduit connected to the outlet for draining fluid from the junction box.

17. The water heater appliance of claim 16, wherein the drain conduit extends between a conduit inlet and a conduit outlet, and wherein the water heater appliance further comprises:

a drain port mounted to a wrapper of the casing, and wherein the conduit inlet of the drain conduit is connected to the junction box at the outlet and the conduit outlet of the drain conduit is connected to the drain port.

18. The water heater appliance of claim 16, wherein the outlet defined by the floor of the junction box is a drain outlet, and wherein the floor of the junction box defines an electrical outlet through which one or more electrical wires extend, and wherein the electrical outlet is positioned above the drain outlet along the vertical direction.

19. The water heater appliance of claim 16, further comprising:

an access panel removably mounted to the casing;

an interior panel spaced from the access panel;

a first dam spanning between the access panel and the interior panel; and a second dam spanning between the access panel and the interior panel, the second dam spaced from the first dam, wherein the access panel, the interior panel, the first dam, and the second dam define a cavity, and wherein the drain conduit extends between a conduit inlet and a conduit outlet, and wherein the conduit inlet of the drain conduit is connected to the junction box at the outlet and the conduit outlet of the drain conduit is positioned within the cavity.

20. The water heater appliance of claim 16, wherein the drain conduit extends through an insulation material disposed between the casing and the tank.

* * * * *